United States Patent [19]

Nadd

[11] Patent Number: 4,910,455
[45] Date of Patent: Mar. 20, 1990

[54] NON-INTRUSIVE CURRENT MEASURING CIRCUIT

[75] Inventor: Bruno Nadd, Lourmarin par Cadenet, France

[73] Assignee: SGS-Thomson Microelectronics S.A., Gentilly, France

[21] Appl. No.: 318,869

[22] Filed: Mar. 6, 1989

[30] Foreign Application Priority Data

Mar. 7, 1988 [FR] France ................. 88 03239

[51] Int. Cl.[4] ................. G01R 19/00; G01R 19/20
[52] U.S. Cl. ................. 324/123 R; 324/99 R; 324/103 P; 307/359; 307/362
[58] Field of Search ............ 324/99 R, 103 P, 123 R, 324/522; 307/351, 359, 362

[56] References Cited

U.S. PATENT DOCUMENTS

| | | | |
|---|---|---|---|
| 3,814,957 | 6/1974 | Way | 307/362 |
| 4,281,262 | 7/1981 | Dressen | 307/362 |
| 4,430,618 | 2/1984 | Mitsueda et al. | 307/359 |
| 4,527,076 | 7/1985 | Matsuo et al. | 307/362 |

OTHER PUBLICATIONS

"MOSFET Measures Current with No Loss" by Frank Goodenough.

Primary Examiner—Reinhard J. Eisenzopf
Assistant Examiner—W. Burns
Attorney, Agent, or Firm—Lowe, Price, LeBlanc, Becker & Shur

[57] ABSTRACT

A current measuring circuit for an integrated circuit comprises an operational amplifier (22), the non-inverting input terminal of which is grounded through a first resistor (23) having a value $R_B$ and a second resistor (21) having a value $R_2$, the junction of those two resistors receiving the current ($I_{NL}$) to be measured, and the output of which is connected by an inverter (26) to a MOS transistor (27). The biasing voltage of the operational amplifier and the characteristics of the inverter are chosen so that the MOS transistor is biased at its threshold in the absence of a current to be measured, whereby the output voltage $V_s$ is correlated with the current to be measured by a linear relation independent of the temperature.

3 Claims, 2 Drawing Sheets

NON-INTRUSIVE CURRENT MEASURING CIRCUIT

BACKGROUND OF THE INVENTION

The instant invention relates to the field of MOS (metal-oxide-semiconductor) integrated circuits.

In such circuits, one often tries to measure a current, for example for causing an action in response to this measuring. One of the difficulties is to be able to measure the current without modifying it and while not being sensitive to physical fluctuations, such as temperature variations or variations in the manufacturing process of the integrated circuit.

An example of the problems that can be encountered will be illustrated in connection with a specific application in relation with FIG. 1. A power MOS transistor 1 of the DMOS-type is usually technologically realized by a very large number $N_p$ of identical cells in parallel. A given number $N_s$ of cells forming a MOS transistor 2 can be arranged in series with a measurement resistor r. The voltage across this resistor gives an evaluation of the current value in the MOS transistor 2 which receives the same gate voltage $V_g$ as the main MOS transistor. This current is normally proportional to the main current according to the ratio $N_s/N_p$. In fact, this is not true since the operation is impaired by the resistor r. $V_1$ being the gate/source voltage of transistor 1 and $V_2$ the gate/source voltage of transistor 2:

$$V_1 = V_2 + rI_2$$

In other terms:

$$I_1/N_p g_m = (I_2/g_m + rN_s I_2)N_s$$

$$I_2/I_1 = (N_s/N_p)(1 + N_g r g_m)^{-1}$$

In those equations, $g_m$ designates the transconductance of the DMOS transistors. It can be seen that when the voltage across resistor r is detected, in order to determine $I_2$, it is not possible to directly deduce therefrom $I_1$ since $g_m$ has to be known. It could be conceivable to take this correction factor into account and obtain a roughly linear relation when r is low. However, the transconductance term $g_m$ is sensitive to the variations of the manufacturing processes and to the temperature. A reliable detector is therefore not achieved.

The problem encountered in this specific case, and in numerous cases for measuring low currents, is to permit measuring without causing any perturbation and especially perturbations correlated with physical parameters liable to variations.

This problem has been studied for a long time and various solutions have been proposed in the art. More generally, if the current supplied by the MOS transistor 2 is considered as being generated by a current source $I_s$, a first solution is illustrated in FIG. 2. It simply consists in connecting the current source to the inverting terminal of an operational amplifier 10, the non-inverting terminal of which is grounded, a feedback resistor R connecting the output of the operational amplifier to its inverting input. Thus, the current source $I_s$ can be considered as being connected to a virtual ground and its operation is not impaired by a measuring resistor. However, this circuit presents the drawback that the voltage at the output of the operational amplifier 10 has to be negative ($-RI_s$); it is therefore necessary to provide a negative biasing voltage source for this operational amplifier, while, in the integrated circuits, one tries to minimize the number of supply sources.

Another circuit according to the prior art, more elaborated and designed to avoid having to resort to negative biasing voltage sources, is illustrated in FIG. 3. This circuit will not be described in detail. However, it will be noted that it comprises three stages of operational amplifiers. The amplifier A1 gives at its output an image of the voltage across resistor r1. The amplifier A3 gives at its output an image of the voltage across resistor r2. The amplifier A2 biases the gate of the transistor T1 so that both images are equal, that is, the voltage across resistor r1 is equal to the voltage across resistor r2. Due to this fact, the voltage across resistor r3 is proportional to the current in resistor r1. This circuit presents the drawbacks of being affected by the offset voltages and exhibits a relatively high time constant, of about 2 microseconds.

Thus, the instant invention aims at realizing a current measuring circuit permitting to avoid impairing the current that is detected and to obtain a measuring voltage substantially independent of the variations of temperature or any other parameter of the integrated circuit containing this measuring circuit.

SUMMARY OF THE INVENTION

In order to achieve this purpose, the instant invention provides for a current measuring circuit in an integrated circuit, comprising:

an operational amplifier the inverting input of which is grounded through a first resistor having a valve $R_B$ and a second resistor having a value $R_2$, the junction of those two resistors receiving the current to be measured, the non-inverting input of which is biased by a dividing bridge comprising a third resistor having a value $R_A$ and a fourth resistor having a value $R_B$ connected between a supply voltage and the ground, the output of which is connected to the input of an inverter, a MOS transistor the gate of which is connected to the output of the inverter, the drain of which is connected to the supply voltage through a fifth resistor having a value $R_1$ and to the first input of the operational amplifier by a sixth resistor having a value $R_A$, the source of which is grounded through a measuring resistor having a value $R_s$.

In this circuit, the second and fifth resistors have low values with respect to the first, third, fourth and sixth resistors, and the biasing voltage of the operational amplifier and the characteristics of the inverter are chosen so that the MOS transistor is biased at its threshold in the absence of current to be measured, with the result that the output voltage is correlated with the current to be measured by the linear relation:

$$V_s = [(1-K)/K][R_2/R_1][I_{NL}R_s]$$

where $K = R_B/(R_A + R_B)$ and $I_{NL}$ is the current to be measured.

Thus, it can be seen that the relation between the output voltage and the input current is only dependent upon ratios of resistors, that are parameters particularly insensitive to the various fluctuations of temperature and manufacturing conditions in an integrated circuit, and to the value of the resistor $R_s$ which will preferably be a resistor external to the integrated circuit in order to obtain a highly accurate resistor.

BRIEF DESCRIPTION OF THE DRAWINGS

Those objects, features, advantages and others of the instant invention will clearly appear from the following detailed description of preferred embodiments, in connection with the attached drawings, wherein.

DETAILED DESCRIPTION OF THE DRAWINGS

Figure 1:
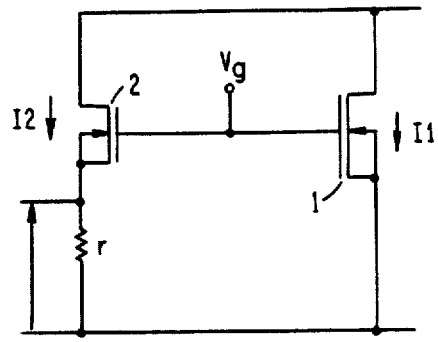
FIG. 1 described hereinabove illustrates the problem the instant invention aims at solving.
Figure 2:
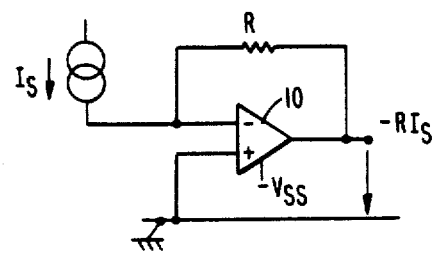
FIGS. 2 and 3 show solutions brought to the problem encountered according to the prior art.
Figure 3:
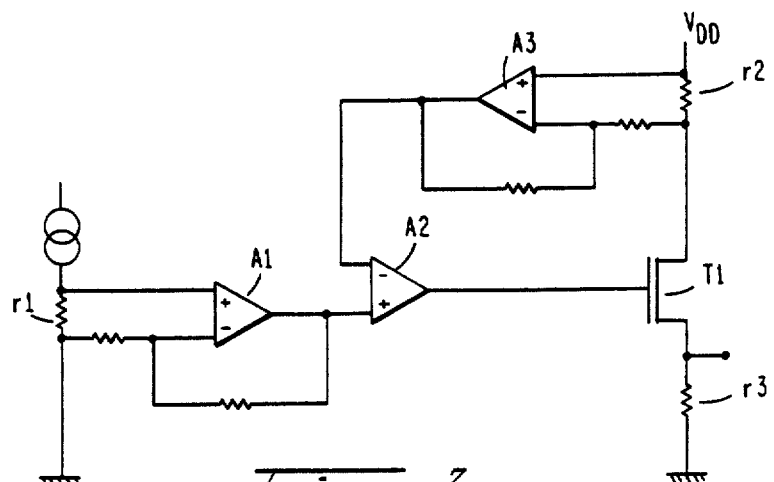
Figure 4:
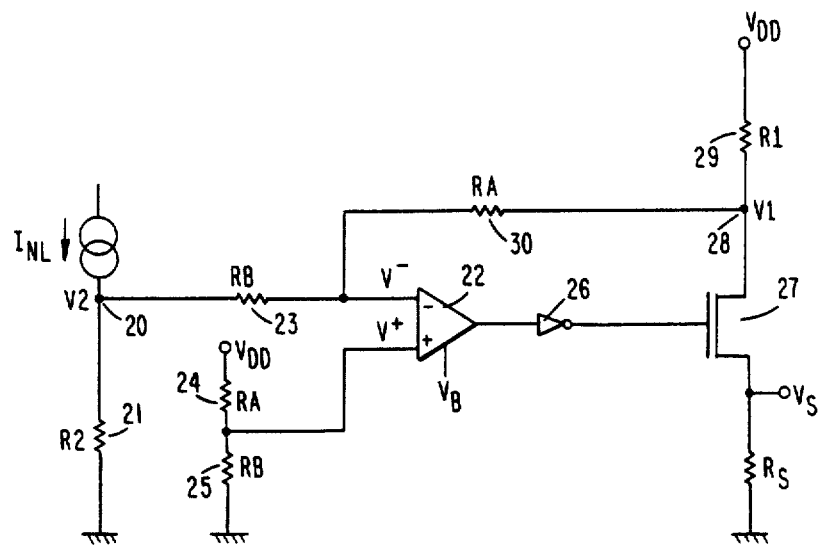
FIG. 4 shows a circuit according to the instant invention.

According to the instant invention, as illustrated in FIG. 4, the source, the current $I_{NL}$ of which is to be measured, is connected to an input terminal 20 in turn grounded through a resistor 21 having a value $R_2$. The voltage on terminal 20 is called $V_2$. The terminal 20 is connected to the inverting input of an operational amplifier 22 through a resistor 23 having a value $R_B$. The non-inverting input terminal of the operational amplifier 22 is connected to the medium tap of a dividing bridge comprising resistors 24 and 25 having values $R_A$ and $R_B$, the second terminal of resistor 24 being connected to the supply source $V_{DD}$ of the circuit and the second terminal of resistor 25 being grounded. The operational amplifier moreover receives a biasing voltage $V_B$. This operational amplifier 22 is connected through a logic inverter 26 to the gate of a MOS transistor 27. The logic inverter 26 is a circuit supplying a high level (1) when its input receives a low level (0) and conversely. The drain of transistor 27 is connected to a terminal 28 in turn connected to the supply voltage $V_{DD}$ through a resistor 29 having a value $R_1$ and connected back to the inverting input of the operational amplifier 22 through a resistor 30 having a value $R_A$. A measurement resistor $R_s$ is connected between the source of the MOS transistor 27 and the ground. It will be shown that the voltage $V_s$ across resistor $R_s$ is proportional to the current $I_{NL}$.

The resistances $R_A$ and $R_B$ are very high with respect to the resistances $R_1$ and $R_2$. For example, in a practical implementation, the resistors $R_A$ and $R_B$ will be formed by depletion MOS transistors and the resistors R1 and R2 by polycrystalline silicon areas. According to the conventional technology, for a same silicon surface, when a polycrystalline silicon resistor has, for example, a value of 20 ohms, a resistor constituted by a depletion MOS transistor having its gate and source connected, has a value of a few kilohms.

On the other hand, the biasing voltage of the operational amplifier 22 is set, as a function of the inverter 26 so that, in the absence of the current $I_{NL}$, when the voltage $V_2$ on the terminal 20 is null, the MOS transistor is approaching its conduction threshold. Let $I_{R1}$ be the current in the resistor 29 having a value $R_1$, $I_{R2}$ the current in the resistor 21 having a value $R_2$, and $I_s$ the measuring current in the resistor $R_s$, and taking into account the choice of the relative values $R_1$ and $R_2$ with respect to $R_A$ and $R_B$, the current $I_s$ is roughly equal to the current $I_{R1}$ and the current $I_{R2}$ is roughly equal to the current $I_{NL}$ which is to be measured.

At the initial state, when $I_{NL}$ and therefore $V_2$ are equal to zero, since, as seen above, the gate of the MOS transistor 27 is biased at a value that is slightly lower than its conduction threshold, the terminal 28 is at the supply voltage, that is $V_1 = V_{DD}$. Moreover, the voltage $V^+$ at the non-inverting input of the operational amplifier is equal to the voltage $V^-$ at the inverting input, that is:

$$V^+ = V^- = V_{DD} \cdot R_B/(R_A + R_B)$$

or $$V^+ = V^- = KV_{DD}, \text{ with } K = R_B/(R_A + R_B) \quad (1)$$

When $I_{NL}$ starts flowing, $V_2$ increases to the value $R_2 I_{NL}$, which causes $V^-$ to increase with respect to $V^+$. Thus, this causes the gate voltage of the transistor 27 to increase and since this gate voltage initially is at the conduction threshold, some current immediately starts flowing in the MOS transistor 27. A current increase in the transistor 27 causes the voltage $V_1$ to drop and the voltage $V_s$ to increase. The decrease of $V_1$ counterbalances the increase of $V^-$ caused by $V_2$ and a balance state where $V^+ = V^-$ is again obtained. The current $I_s$ in the resistor 29 ($R_1$), in the transistor 27 and in the resistor $R_2$ is therefore correlated with the presence or the absence of a current $I_{NL}$ in the resistor 21 ($R_2$). The following formula can therefore be established from relation (1):

$$K(V_{DD} - R_1 I_s) + (1-K)R_2 I_{NL} = KV_{DD}$$

or $$I_s = I_{NL}(R_2/R_1)[1-K)/K],$$

that is $$V_s = (I_{NL} R_s)(R_2/R_1)[1-K)/K].$$

It can be seen that the output voltage is a linear function of the input current in the detector and only depends upon the latter by resistor ratios and by the value of the resistor $R_s$. Those resistor ratios are liable to be very accurate and the resistor $R_s$ will preferably be a precision resistor external to the integrated circuit.

I claim:

1. A current measuring circuit for an integrated circuit, comprising:
   an operational amplifier (22)
   the inverting input terminal of which is grounded through a first resistor (23) having a value $R_B$ and a second resistor (21) having a value $R_2$, the junction of said two resistors receiving the current ($I_{NL}$) to be measured,
   the non-inverting input of which is biased by a dividing bridge comprising a third resistor (24) having a value $R_A$ and a fourth resistor (25) having a value $R_B$ connected between a supply voltage and the ground,
   the output of which is connected to the input of an inverter (26),
   a MOS transistor (27)
   the gate of which is connected to the inverter output,
   the drain of which is connected to the supply voltage through a fifth resistor (29) having a value $R_1$ and to the first input of the operational amplifier through a sixth resistor (30) having a value $R_A$, the source of which is grounded through a measurement resistor having a value Rs, the second and fifth resistors having low values with respect to the first, third, fourth and sixth resistors, the biasing voltage of the operational amplifier and the characteristics of the inverter being chosen so that the MOS transistor is biased at its threshold in the absence of a current to be measured, whereby the output voltage is correlated with the current to be measured by the linear relation:

$$V_s = [(1-K)/K][R_2/R_1][I_{NL}R_s]$$

where $$K = R_B/(R_A + R_B).$$

2. A current measuring circuit according to claim 1, wherein the resistors having a high value are realized by means of depletion MOS transistors, the sources of which are connected to their gate and wherein the low value resistors are constituted by polycrystalline silicon resistors.

3. A current measuring circuit according to claim 1, wherein the measuring resistor ($R_s$) is external to the integrated circuit.

* * * * *